United States Patent [19]

Kokta et al.

[11] 4,293,371

[45] Oct. 6, 1981

[54] METHOD OF MAKING MAGNETIC FILM-SUBSTRATE COMPOSITES

[75] Inventors: Milan R. Kokta; Roger W. Taylor, both of San Diego, Calif.

[73] Assignee: Union Carbide Corporation, New York, N.Y.

[21] Appl. No.: 134,640

[22] Filed: Mar. 27, 1980

[51] Int. Cl.³ .............................................. C30B 19/00
[52] U.S. Cl. ............................ 156/624; 156/DIG. 63
[58] Field of Search .................... 156/624, DIG. 63; 148/171, 1.5, 172; 427/86, 87

[56] References Cited

U.S. PATENT DOCUMENTS 3,790,405  2/1974  Levinstein ........................... 156/624

OTHER PUBLICATIONS

Crystals for Magnetic Applications, Editor Rooijmans, Springer-Verlag N.Y., 1978, pp. 85,90.

Primary Examiner—Hiram Bernstein
Attorney, Agent, or Firm—Frederick J. McCarthy, Jr.

[57] ABSTRACT

Magnetic film-substrate composites of enhanced quality are provided by rotating a garnet substrate immersed in a melt of magnetic film material to obtain a growth of magnetic film having uniaxial anistropy on the substrate normal to the substrate surface and maintaining the immersed substrate stationary in the melt after a desired film growth has been achieved to effect enhancement of the anisotropy constant of the film.

3 Claims, 2 Drawing Figures

METHOD OF MAKING MAGNETIC FILM-SUBSTRATE COMPOSITES

The present invention is directed to the growth of epitaxial magnetic films on garnet substrates to provide a composite for use in magnetic bubble applications. More particularly, the present invention is a technique for providing high quality composites of magnetic films on garnet substrates, such films having enhanced uniaxial aniosotropy.

The use of thin film-substrate composites for magnetic bubble applications is well known and techniques for the making of such composites by liquid phase epitaxy (LPE) are disclosed in U.S. Pat. No. 3,790,405—H. J. Levinstein—issued Feb. 5, 1974 and U.S. Pat. No. 3,837,911—A. H. Bobeck, H. J. Levinstein, L. K. Shick—issued Sept. 24, 1974.

In a well known LPE technique a molten oxide-flux solution is super cooled and an appropriately crystallographically oriented garnet substrate, e.g., in wafer form suitably about 0.02 inch thick and about one to three or more inches in diameter is immersed in the super cooled melt and film growth takes place on the substrate surface, the composition of the film being selectively different from the composition of the garnet substrate so that the LFE film grown on the substrate is characterized by uniaxial magnetic anisotropy. A film growth rate on the order of about 0.25 to 1 micron per minute can be readily achieved with the LPE procedure and a desired film thickness can be obtained in a few minutes. The LPE technique is practiced under isothermal conditions and a common practice is to continuously rotate or oscillate the immersed wafer substrate in a plane parallel to the surface of the super cooled garnet oxide melt during growth in order to achieve essentially uniform film growth over the wafer surface.

It is an object of the present invention to provide an improved liquid phase epitaxy technique for making thin magnetic film-garnet substrate composites.

Other objects will be apparent from the following description and claims wherein:

Figure 1:
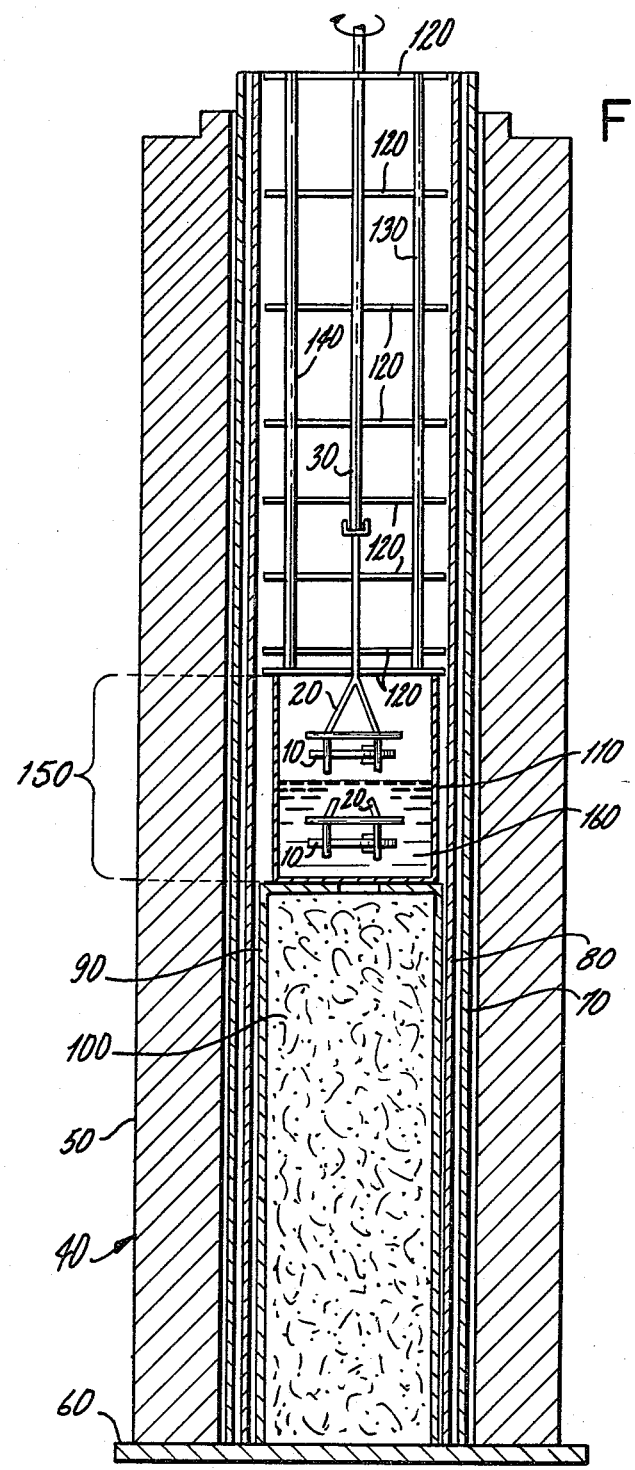
FIG. 1 shows apparatus suitable for the practice of the present invention.

In the practice of the present invention a melt of magnetic film forming material is used comprising at least two different elements in oxide form which will react to form a film characterized by magnetic ordering. Suitably a garnet oxide containing melt is used which will provide a magnetic garnet film having uniaxial anistropy as described in above-noted U.S. Pat. No. 3,837,911 e.g. a garnet composition containing at least two cations, usually two rare earth ions, in the dodecahedral site, suitably of the general nominal stoichiometry of $Y_3Fe_5O_{12}$. Examples of suitable film compositions as noted in U.S. Pat. No. 3,837,911 are:

$Gd_{2.34}Tb_{0.66}Fe_5O_{12}$
$Gd_{2.325}Tb_{0.383}Eu_{0.09}Fe_5O_{12}$
$Er_2Eu_1Ga_7Fe_{4.3}O_{12}$
$Gd_{2.10}Tb_{0.9}Fe_5O_{12}$
$Gd_{2.79}Tb_{0.21}Fe_5O_{12}$
$Gd_{2.70}Nd_{0.30}Fe_5O_{12}$
$Y_{1.00}Gd_{2.00}Al_{0.33}Fe_{4.67}O_{12}$
$Y_{1.03}Gd_{1.29}Yb_{0.68}Al_{0.7}Fe_{4.3}O_{12}$
$Y_{1.75}Gd_{1.0}Eu_{0.25}Al_{0.6}Fe_{4.4}O_{12}$

Preferred film composition based on the foregoing are modified with calcium and germaium and include samarium, thulium and lutetium. Exemplary compositions are as follows: $\{Y_{0.462}Sm_{0.28}Ca_{0.94}Lu_{0.318}\{[Lu_{0.22}Fe_{1.958}Ge_{0.02}](Fe_{2.08}Ge_{0.92})O_{12}$ $\{Y_{0.46}Sm_{0.46}Ca_{0.7}Lu_{0.38}\}[Lu_{0.020}Fe_{1.98}](Fe_{2.3}Ge_{0.72})O_{12}$ Such compositions are suitably prepared by melting a mixture of oxides of the respective elements.

In addition to the foregoing garnet film compositions other suitable film compositions are hexagonal ferrites e.g. $Ba_2Zm_2Fe_{12}O_{22}$, $Ba\ Fe_{12}O_{19}$ and spinel ferrites $Me^{2+}\ Ga_2O_4$, $Me^{2+}\ La_2O_4$, $Me^{2+}\ FeO_4$ where $Me^{2+}$ is Mg, Ni, or Cu.

A garnet substrate on which the magnetic film is grown is a (111) or (100) garnet wafer having a lattice parameter closely matched to that of the film at room temperature as described in the above-noted U.S. Pat. No. 3,897,911; the preferred substrates, also described in U.S. Pat. No. 3,897,911, are $Gd_3Ga_5O_{12}$ and $Nd_3Ga_5O_{12}$, other suitable substrates are $Sm_3Ga_5O_{12}$, $Eu_3Ga_5O_{12}$, $Gd_3In_2Ga_3O_{12}$, $Gd_3Sc_2Ga_3O_{12}$ With an appropriate substrate, e.g. a (111) wafer of $Gd_3Ga_5O_{12}$-gadolinum gallium garnet (GGG) and a super cooled melt e.g. a previously described preferred garnet composition in solution with a flux such as a PbO or $Bi_2O_3$ system at a temperature of 960° C., the wafer is immersed in the super-cooled melt under isothermal conditions, with the flat surface of the immersed wafer which is to receive the film being parallel to the surface of the melt and being rotated in a plane parallel to the surface of the melt. Film growth proceeds on such surface of the immersed GGG wafer and when a desired nominal film growth is achieved e.g. 3 microns the rotation of the wafer is stopped and the wafer is maintained stationary for from 0.5 to 50 seconds. When rotation is stopped there is only a very slight increase in the film thickness, e.g. 10 to 800 angstroms. The composition of the very slight film growth which occurs while the wafer is stationary varies from the composition obtained during rotation on account of the changed growth conditions. The change in composition is very slight and is not directly determinable but is evidenced by a resultant increase in magnetic anisotropy. After the stationary period, the wafer is removed from the melt. The film grown during rotation is directionally anisotropic in a direction perpendicular to the film surface, e.g. substrate surface and the slight growth during the stationary period is directionally anisotropic in composition in the same direction and significantly enhances the anisotropy of magnetic properties in this direction.

Figure 2:
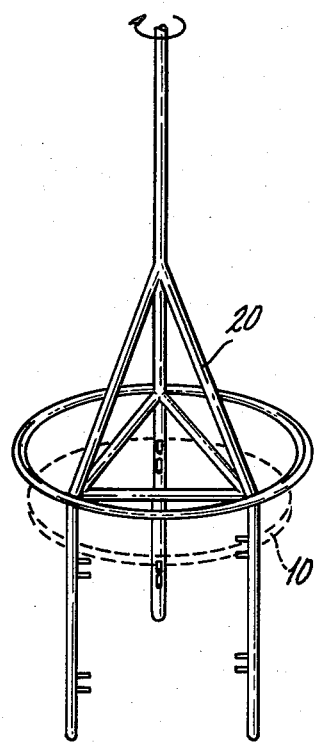
FIG. 2 shows a more detailed view of a portion of the apparatus of FIG. 1.

The resulting thin magnetic film-substrate garnet composite is characterized by increased quality factor, which is a measure of bubble stability in the film, due to an enhanced uniaxial anisotropy constant, Ku. The quality factor, Q, for a film is directly proportional to the anisotropy constant of the film, Ku, and is defined by the well known equation as follows:

$$Q = Ku/(2\pi Ms)^2$$

where
Ku is the anisotropy constant of the film
Ms is the saturation magnetisation of the film The present invention will be more fully understood in connection with FIG. 1 of the drawing wherein a garnet substrate 10, e.g. a circular GGG wafer 0.020 inch thick, 3 inch diameter, <111> orientation, is arranged in a platinum wire support 20 illustrated more fully in FIG. 2. Support 20 is fixedly attached to alumina rod 30 which is coupled to a conventional crystal puller, not shown, which can be actuated to raise and lower and rotate support 20, and substrate 10. The substrate 10 is located within a resistor type furnace 40, e.g. Minibrate, Thermco Products Corp., which comprises a water-cooled shell 50 supported on an alumina plate 60 and surrounding concentric alumina tubes 70, 80 and alumina pedestal 90. Ceramic insulation, e.g. Fiberfrax Trademark of Carborundum Co., is provided in the space 100 under alumina pedestal 90 for heat shielding. A platinum crucible 110 is mounted on pedestal 90 and a plurality of concentric platinum baffles 120, separated by and supported by concentric alumina tubes 130, 140 which serve to align the platinum baffles.

Upon energization of furnace 40 an isothermal zone 150 is established within alumina tube 80, e.g. at 960° C. A suitable oxide-flux melt 160 e.g. garnet-$PbO:B_2O_3$ is provided in crucible 110. The melt is maintained at the temperature of the isothermal zone 150. Garnet substrate 10 is positioned in the isothermal zone 150 above the surface of melt 160 with its flat surfaces parallel to the melt surface and the temperature of the wafer is established at the temperature of the isothermal zone 150. Substrate 10 is rotated in a plane parallel to the melt surface, e.g. from 10 to 500 rpm with the faster rotations being used with smaller diameter, e.g. one inch, wafers and the slower speeds being used with larger diameter wafers e.g. up to four inches. The rotation can be oscillating e.g. one or more revolutions clockwise and counter-clockwise, with essentially instantaneous reversal of rotation direction i.e. the wafer rotation is reversed is less than 10 about micro seconds. The substrate is lowered into and immersed in melt 160 with rotation continuing. Based on the design and known performance of a furnace apparatus, a magnetic film growth, from the melt onto the $<111>$ flat surface of the garnet substrate, usually in the range of 0.4 to 1.0 micron per minute, can be predicted, typically 0.5 micron per minute. When a desired predetermined nominal film growth has been achieved, e.g. 3 microns inch, which is suitable to support magnetic bubbles, the rotation of substrate 10 is halted and the film-substrate composite is maintained stationary in melt 160 for from 0.5 seconds or longer, suitably about 12 seconds. The length of the stationary period is that sufficient to provide enhancement of magnetic anisotropy due to the very slight additional film growth during the stationary period. Some enhancement is obtainable in about 0.5 seconds with about 10 to 20 seconds being sufficient to provide substantial enhancement with practically no significant improvement after about 50 seconds; a stationary period of more than 5 minutes could lead to undesirable nucleation from the melt. While the substrate is stationary there is no further substantial increase in the film thickness; however a very thin film of slightly different composition form the film grown during rotation is formed during the stationary period. After the stationary period, the film-wafer composite is raised out of the melt and rotated again at 300 rpm for 3 min. then withdrawn from the apparatus. The magnetic film of the resulting garnet film-substrate composite has uniaxial anisotropy and is capable of supporting bubbles with enhanced bubble stability due to enhanced Ku, uniaxial anisotropy constant.

The following examples will further illustrate the present invention.

EXAMPLE I

A melt in the amount of 6000 grams having the composition shown below was provided in a 0.05 inch thick platinum crucible 4 inches I.D. by 6 inches.
$Y_2O_3$ 16.071 grams
$Sm_2O_3$ 5.58 grams
$Lu_2O_3$ 11.938 grams
CaO 33.97 grams
$GeO_2$ 77.4337 grams
$Fe_2O_3$ 487.7 grams
$B_2O_3$ 105.18 grams
PbO 5057.88 grams The melt-containing crucible was heated by a resistor furnace which maintained an isothermal zone at a temperature of 960° C. surrounding the crucible. A 0.020 inch thick 3 inch diameter substrate of GGG $<111>$ was supported by a holder in a plane parallel to the surface of the melt in the crucible and positioned above the melt surface in the isothermal zone to heat the substrate to the temperature of the isothermal zone. The heated substrate was rotated at 80 rpm (2 revolutions clockwise, then 2 revolutions counter clockwise with a reversal time of lees than 10 micron-seconds in a plane parallel to the surface of the melt in the crucible and while rotating, the substrate was lowered and immersed in the melt. The rotation was continued with the substrate immersed in the melt for a time sufficient to grow a 3 micron thick film of Y LuCa $[Fe_2](Fe_2Ge)O_{12}$ on the $<111>$ surface of the substrate; the film growth time was 6 minutes, after which rotation of the substrate was halted for 12 seconds with the substrate remaining immersed in the melt. At the end of the 12 second stationary period rotation of the substrate was resumed and the substrate was raised, in 10 seconds, out of the melt. After cooling to room temperature the anisotropy constant, Ku, of the film on the substrate was determined and the value obtained was $2.19 \times 10^4$ erg/cm$^3$.

EXAMPLE II

The same procedure was followed as in Example I except that the rotation of the immersed substrate was continuous and was not halted. The value of Ku was $1.68 \times 10^4$ erg/cm$^3$. By comparing the value of Ku for Example I, in accordance with the present invention, with that obtained in Example II, it can be seen that a substantial increase in Ku is obtained through the practice of the present invention which means substantial increase of growth induced anisotropy in the film without, impeding magnetic bubble mobilities as in the case of garnet film containing high samarium or thulium concentrations.

What is claimed is:

1. In a method of growing a magnetic film on a garnet substrate wherein a garnet substrate of a first composition is immersed and rotated in a melt of a different composition comprising at least two different oxides which will form a film characterized by magnetic ordering in a plane substantially parallel to the surface of the melt and is withdrawn from the melt when a suitable thickness of film growth is provided on the substrate, the improvement which comprises maintaining the immersed substrate stationary in the melt after a suitable thickness of film growth is provided on the substrate for from about 0.5 seconds to 5 minutes.

2. A method in accordance with claim 1 wherein the immersed substrate is maintained stationary for from about 0.5 to 50 seconds.

3. A method in accordance with claim 1 wherein the immersed substrate is maintained stationary for from about 10 to 20 seconds.

* * * * *